United States Patent [19]
Chen et al.

[11] Patent Number: 6,162,713
[45] Date of Patent: Dec. 19, 2000

[54] METHOD FOR FABRICATING SEMICONDUCTOR STRUCTURES HAVING METAL SILICIDES

[75] Inventors: Li-Yeat Chen, Hsin-Chu; Haber Chen, Taipei; Wen-Yi Shieh, Hsin-Chu, all of Taiwan

[73] Assignee: United Microelectronics Corp., Hsin-Chu, Taiwan

[21] Appl. No.: 09/334,863

[22] Filed: Jun. 17, 1999

[51] Int. Cl.[7] .............................................. H01L 21/3205
[52] U.S. Cl. ...................... 438/585; 438/660; 438/663; 438/664; 438/683
[58] Field of Search .................. 438/585–660, 438/663–664, 682–683

[56] References Cited

U.S. PATENT DOCUMENTS

| | | | |
|---|---|---|---|
| 5,170,242 | 12/1992 | Stevens et al. | 257/51 |
| 5,518,958 | 5/1996 | Giewont et al. | |
| 5,576,228 | 11/1996 | Chen et al. | |
| 5,600,165 | 2/1997 | Tsukamoto et al. | 257/323 |
| 5,608,266 | 3/1997 | Agnello et al. | 257/768 |
| 5,851,922 | 12/1998 | Bevk et al. | 438/655 |
| 5,880,502 | 3/1999 | Lee et al. | 257/372 |
| 5,903,053 | 5/1999 | Iikima et al. | 257/751 |
| 5,972,763 | 10/1999 | Chou et al. | 438/305 |

*Primary Examiner*—Long Pham
*Attorney, Agent, or Firm*—Harness, Dickey & Pierce, P.L.C.

[57] ABSTRACT

Several processes for forming semiconductor gate structures having treated titanium silicide layers are disclosed. There are at least three methods been provided for the present invention and a summarized general procedure of all the methods comprises the following steps: The first step is to provide a silicon substrate having a gate oxide layer formed on top the silicon substrate, and forming a polysilicon layer over the gate oxide layer, followed by the formation of a TiN layer over the polysilicon layer. A treated titanium silicide layer is then formed on top of the TiN layer. Sequentially, an anti-reflection (SiON) film is deposited on top of the treated titanium silicide layer with a capping layer formed over the anti-reflection film. Finally, patterning and etching the above layers to expose a portion of the gate oxide layer and to form a gate electrode, where the final gate structure is rounded up by a rapid thermal process (RTP). The step of forming a treated titanium silicide layer further comprises one of the following: impurity doping by implantation, sputtering with nitrogen gas, and using $TiSi_xM_y$ target. As a result of this, a wider thermal-stress window has been achieved by the present invention.

26 Claims, 9 Drawing Sheets

METHOD FOR FABRICATING SEMICONDUCTOR STRUCTURES HAVING METAL SILICIDES

BACKGROUND OF THE INVENTION

1. Field of the Invention

The present invention relates to several processes for fabricating gate structures in a MOS device, and more particularly, for fabricating gate structures having improved gate materials in which the stress and the thermal stability of the improved gate materials are decreased and enhanced respectively.

2. Description of the Prior Art

Metallic silicides have been used as an interconnection material for fabricating semiconductor components in integrated circuits in order to overcome certain inherent disadvantages of polycrystalline silicon. The primary disadvantage of this material is its minimum sheet resistivity that is about 10 ohms per square. Various silicides, materials formed by the reaction of a refractory metal or a near-noble metal with silicon, have been used on the polycrystalline silicon because of the reduced sheet resistance in order to improve the performance of large scaled integrated circuits. The metallic suicides permit the scaling down of interconnects and gate line widths that is required to achieve very large scale integration.

Self-aligned silicide processes or salicide processes are commonly employed to provide a metal silicide layer over the polysilicon gate electrode and over the source/drain regions of the silicon substrate, to facilitate electrically and metallurgically connecting the silicon to metal interconnects. A salicide process normally comprises the following steps: Firstly, a MOS transistor having a gate, source/drain regions, and spacers are formed above a silicon substrate. Secondly, a metallic layer with a thickness of about 200 angstroms to 1000 angstroms is then deposited on the surface of the silicon substrate through a magnetron DC sputtering method. Thirdly, upon application of a high temperature, part of the metallic layer reacts with silicon above the source/drain regions and polysilicon above the gate of the MOS transistor, thereby forming silicide layers. Finally, unreacted residual metal remaining after the reactive process is then removed by a wet etching method, thereby leaving behind the metal silicide layer on the top surfaces of the MOS terminals.

Figure 1:
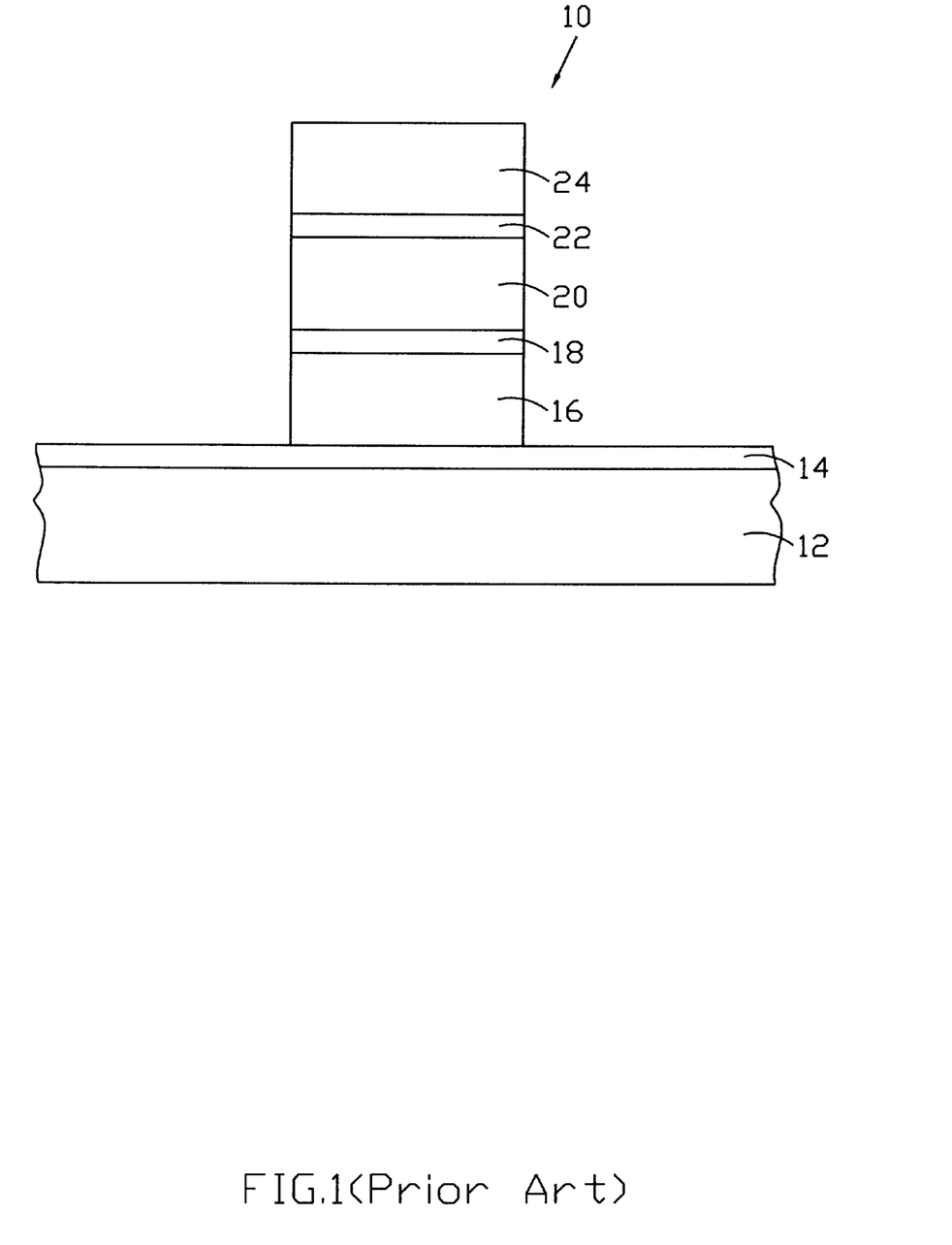
FIG. 1 is a cross-sectional view of a semiconductor gate structure having a titanium silicide layer.

Titanium (Ti) is one of the most commonly used materials for the salicide processes and as a gate material in ULSI technology. Other materials utilized include cobalt (Co), nickel (Ni), platinum (Pt), tungsten (W), molybdenum (Mo), and copper (Cu). FIG. 1 shows a conventional gate structure 10 using titanium silicide as a gate material in ULSI technology. The gate structure comprises a silicon substrate 12 having a gate oxide layer 14 formed thereon. A polysilicon layer 16 is deposited over the gate oxide layer follows by the coating of a barrier layer 18 over the polysilicon layer. Next, the salicide process mentioned before is used to form a titanium silicide layer 20 over the barrier layer. Finally, an anti-reflection film 22 is coated on top of the titanium silicide layer and a capping layer 24 is formed thereon for the purpose of self-aligned contact (SAC) under 0.25 micro technologies.

The titanium silicide layer formed by a conventional salicide process has two basic structures, a metastable C-49 phase titanium silicide (C-49 $TiSi_x$) structure and a thermodynamically more stable C-54 phase titanium silicide (C-54 $TiSi_2$) structure having a lower resistance. C-49 phase titanium silicide has a resistance of between about 60 $\mu\Omega/cm$ to 90 $\mu\Omega/cm$ and a formation temperature of between about 400°C to 500°C. C-54 phase titanium silicide has a lower resistance of between about 14 $\mu\Omega/cm$ to 16 $\mu\Omega/cm$, but a rather high formation temperature of between about 700°C to 750°C. In the manufacturing process, generally the higher resistance C-49 phase titanium silicide will be transformed to a lower resistance C-54 phase titanium silicide through the application of a rapid thermal processing (RTP).

Figure 2:
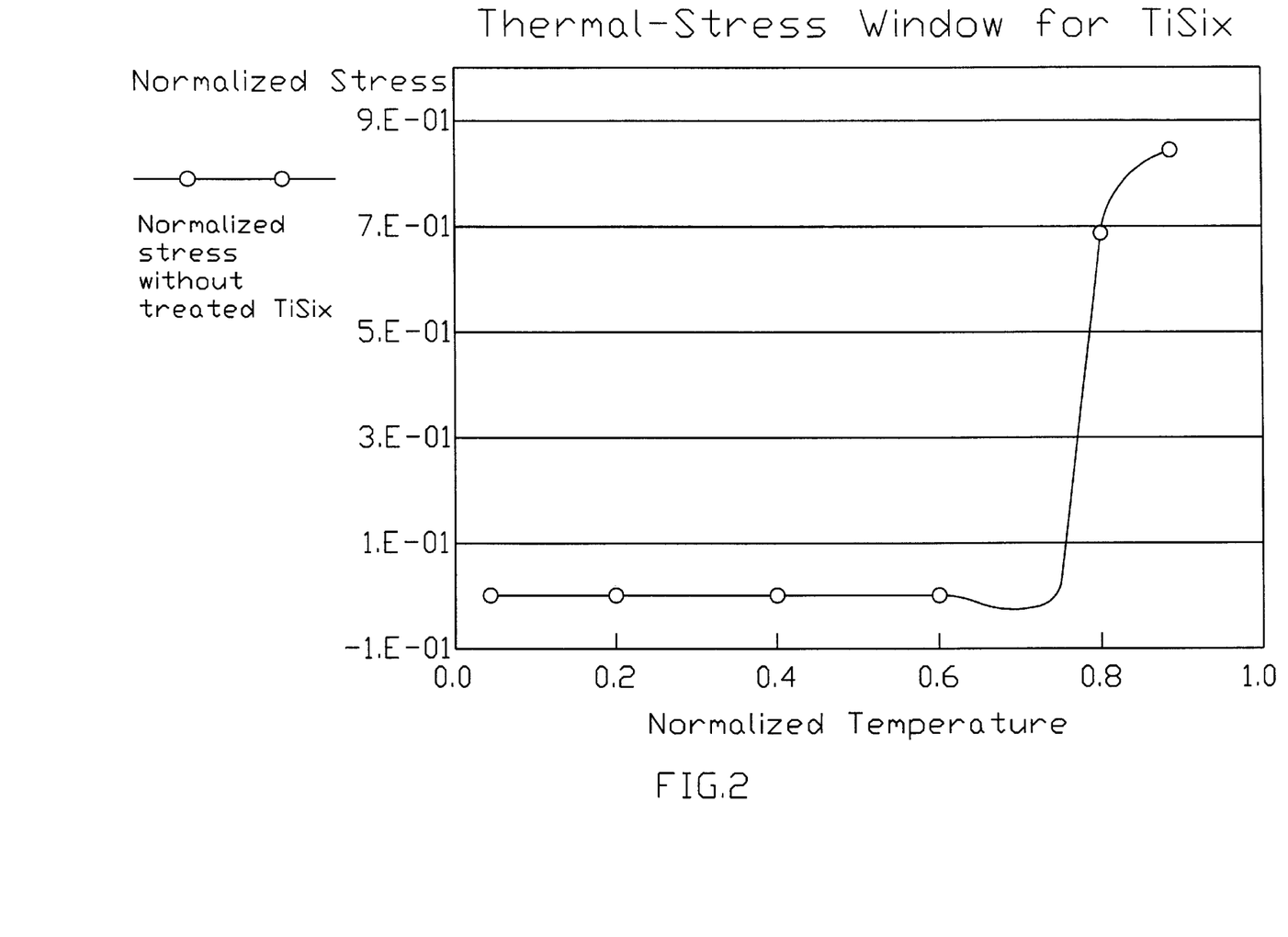
FIG. 2 is a graph showing the thermal stress window for the untreated titanium silicide.

The sputtered titanium silicide layer intrinsic high stress characteristic after high temperature RTP is shown in FIG. 2, where a curve of normalized stress against normalized temperature is drawn to show the thermal stress window for titanium silicide. As what is shown, the stress for titanium silicide rises rapidly after been heated above a normalized temperature of about 0.7, and some peeling phenomena can be observed therein. Therefore, something has to be done in order to protect the titanium silicide layer from peeling during or after a high temperature RTP process, thus an alternative process for fabricating a gate structure in ULSI technology is desired.

SUMMARY OF THE INVENTION

In accordance with the present invention, several processes are provided for fabricating semiconductor gate structures having treated metal suicides as gate materials that substantially decrease the stress and enhance the thermal stability of metal silicide layers. There are at least three methods been proposed for the present invention to overcome all the drawbacks of the conventional methods, and they are impurity doping by implantation, sputtering with nitrogen gas, and using $TiSi_xM_y$ target.

In one embodiment of the present invention, the method of impurity doping by implantation is shown in FIG. 4A–4I, where these figures merely show the key steps of the present embodiment in a sequence. In a brief summary, the method of the present embodiment comprises the following steps: First of all, a semiconductor substrate is provided with a gate oxide layer formed on top of the semiconductor substrate, and a polysilicon layer formed on the gate oxide layer. Then, a barrier layer is formed over the polysilicon layer and a metal silicide layer formed on top of the barrier layer by using the salicide process described in the prior art section. Next, these steps are followed by an anti-reflection film deposition on top of the metal silicide layer.

A dopant, like argon or nitrogen, is then implanted into the metal silicide layer by passing through and after depositing the anti-reflection film. Sequentially, a nitride capping layer formed over the anti-reflection film for the purpose of self-aligned contact (SAC) under 0.25 micro technologies. Finally, the resulting structure at this stage is patterned and etched to expose a portion of the gate oxide layer and to form a gate electrode. Herein, a rapid thermal process (RTP) is carried out.

In another embodiment of the present invention, the method of sputtering with nitrogen gas is shown in FIG. 5A–5H, where these figures merely show the key steps of the present embodiment in a sequence. In a brief summary, the method of the present embodiment comprises the following steps: First of all, a semiconductor substrate is provided with a gate oxide layer formed on top the semiconductor substrate, and a polysilicon layer formed on the gate oxide layer. Next, the formation of a barrier layer over the polysilicon layer occurs.

Sequentially, a metal silicide layer is deposited by mixing with nitrogen gas, and lying on top of the barrier layer, where the nitrogen gas was injected while carrying out the sputtering procedure during a salicide process. Then an anti-reflection film is deposited on top of the metal silicide layer, with a capping layer formed over the anti-reflection film. Finally, the resulting structure at this stage is patterned and etched to expose a portion of the gate oxide layer and to form a gate electrode. Herein, a rapid thermal process (RTP) is carried out.

Figure 3:
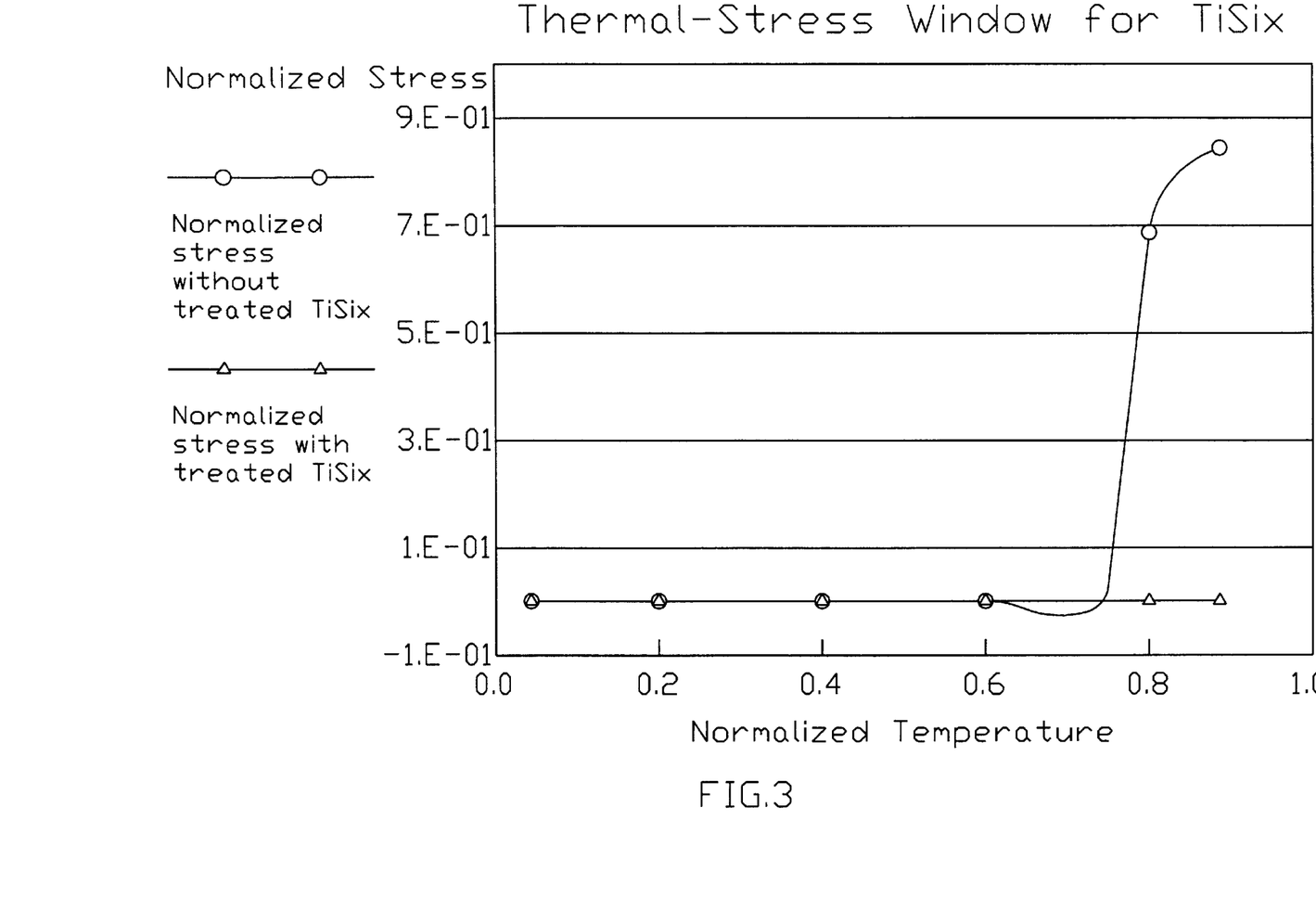
FIG. 3 is a graph showing the thermal stress window for both the treated and the untreated titanium silicide.

In a further embodiment of the present invention, the method of using $TiSi_xM_y$ compound alloy target is very similar to the previous embodiments, especially to the method of sputtering with nitrogen gas. The only difference between the last two embodiments is a stage replacement of nitrogen gas sputtering by $TiSi_xM_y$ compound alloy layer formation. Hereto, no matter which method is used for the present invention, the treated metal silicide simply shows a better intrinsic stress characteristic than the untreated metal silicide. Experimental thermal stress curves for both the treated and the untreated titanium silicide are shown together in FIG. 3, the thermal stress window is extended to about 0.9 for the treated titanium silicide as compare to about 0.7 for the untreated one.

It is to be understood that both the foregoing general description and the detailed description are exemplary and explanatory only and are not restrictive of the present invention, as claimed.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 4A to FIG. 4I depict the process flow of one embodiment according to the present invention in cross-sectional views.

FIG. 5A to FIG. 5H depict the process flow of another embodiment according to the present invention in cross-sectional views.

DESCRIPTION OF THE PREFERRED EMBODIMENT

Referring to FIG. 4A–FIG. 4I, the process flow of one embodiment according to the present invention is depicted in cross-sectional views. These drawings merely show several key steps in sequential processes.

Figure 4A:
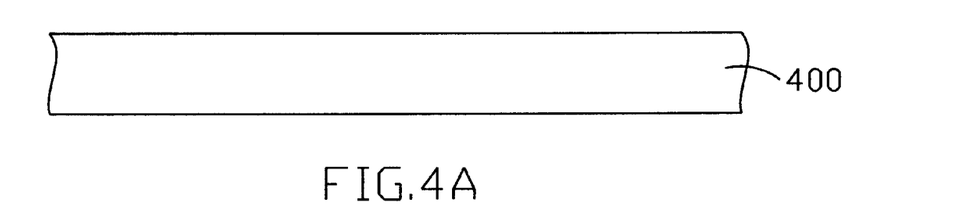
Figure 4B:
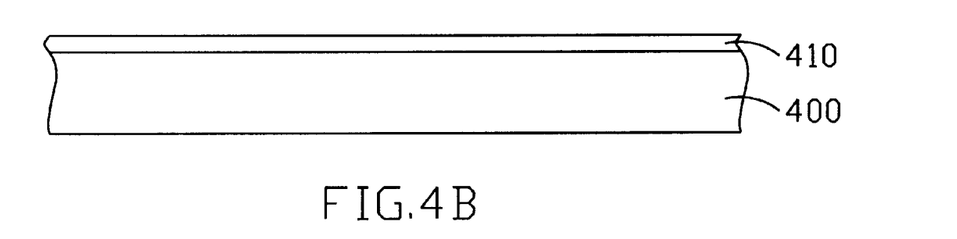
Figure 4C:
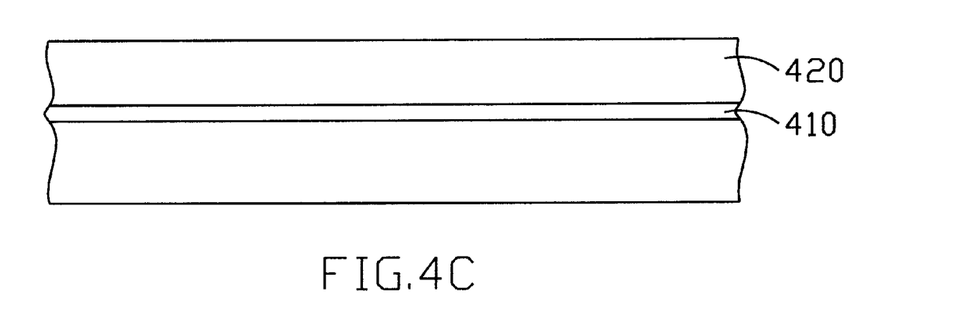
Figure 4D:
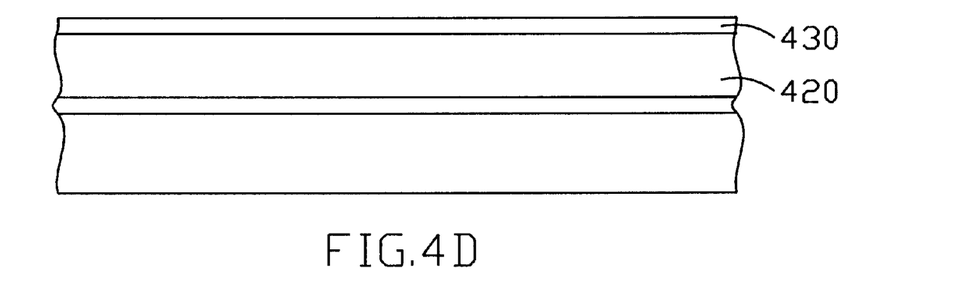

First of all, in FIG. 4A, a silicon substrate 400 is provided and is followed by by FIG. 4B, the formation of an insulating film 410 on top of the silicon substrate. The insulating film functions as a gate oxide layer, which comprises silicon dioxide or any other insulating material. In FIGS. 4C and 4D, a polysilicon layer 420 and a barrier layer 430 are deposited respectively, where the polysilicon layer lays in between the insulating film 410 and the barrier layer 430. The barrier layer is made of titanium nitride (TiN), which is used to prevent the formation of silicide between metal and silicon, or used to enhance the adhesion between metal and other materials.

Figure 4E:
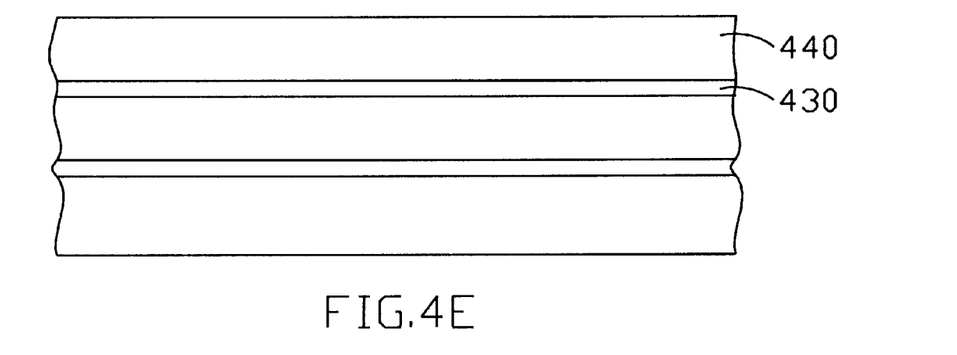
Figure 4F:
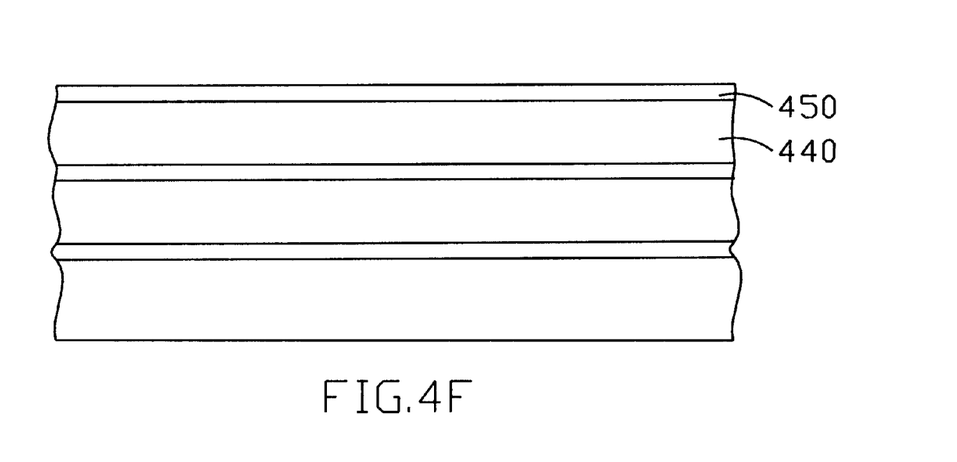

Next, due to the reduction in ohmic contacts between metallic layers and gate electrodes causes by the barrier layer, a layer with better conductivity is needed. Hence, a titanium silicide layer 440 is deposited over the barrier layer 430, as what is shown in FIG. 4E. The formation of this silicide layer is accomplished by applying a sequence of process similar to the salicide process described in the prior art section. Sequentially, an anti-reflection film 450 comprises SiON is coated over the titanium silicide layer 440, as shown in FIG. 4F, where it is simply used to avoid unaccurate pattern transference during photolithography process.

Figure 4G:
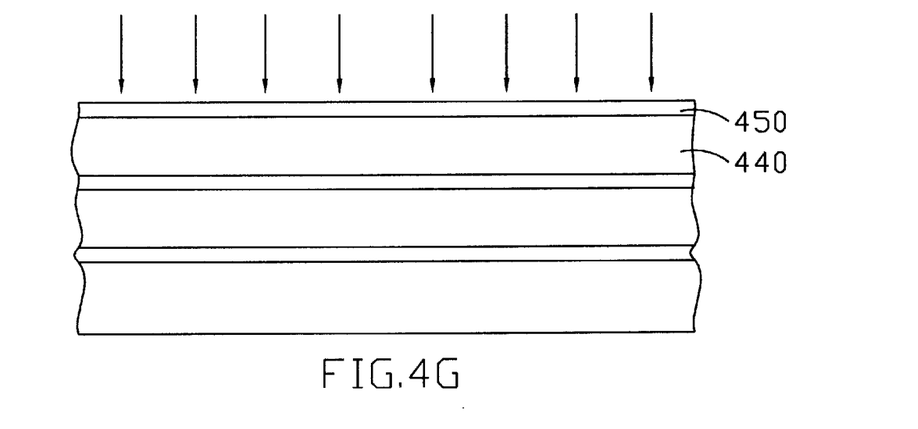

FIG. 4G shows an implantation process been carrying out to implant dopant, like argon or nitrogen, into the titanium silicide layer 440 by penetrating through and after the deposition of the anti-reflection film 450. The dopant, having a dosage ranging from about 1.tmes.10.sub.14 to about 5.times.10.sub.15, has been implanted at an energy ranging from about 20 keV to about 100 keV, and it is aiming to decrease the stress and enhance the thermal stability of titanium silicide. Therefore, the resulting doped titanium silicide layer has a better thermal-stress characteristic than the undoped ones.

Figure 4H:
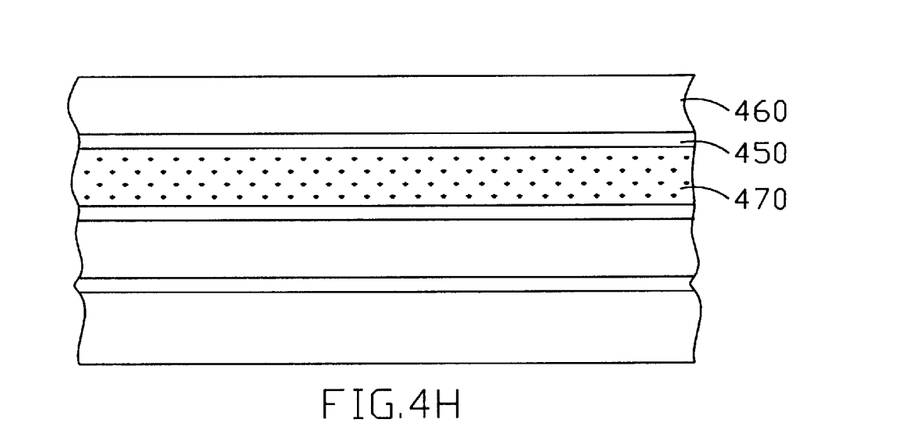
Figure 4I:
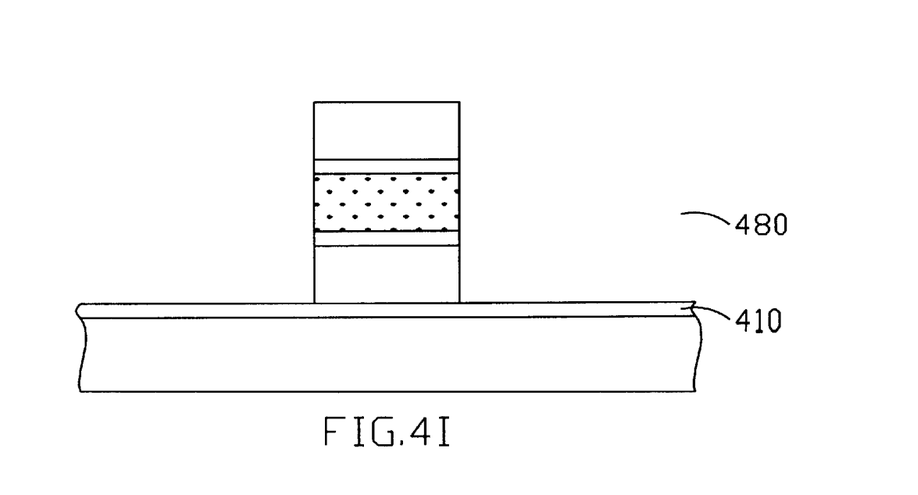

Finally, as shown in FIGS. 4H and 4I, a nitride capping layer 460 comprises silicon nitride (SiN) is formed on top of the anti-reflection film 450 and above the doped titanium silicide layer 470 for the purpose of self-aligned contact (SAC) under 0.25 micro technologies. Then, patterning and etching the above layers to expose a portion of the insulating film 410 and to form a gate electrode 480, follows by a rapid thermal process (RTP) to transform a metastable C-49 phase titanium silicide (C-49 $TiSi_x$) structure to a thermodynamically more stable C-54 phase titanium silicide (C-54 $TiSi_2$) structure having a lower resistance.

Referring to FIG. 5A–FIG. 5H, the process flow of another embodiment according to the present invention is depicted in cross-sectional views. These drawings merely show several key steps in sequential processes.

Figure 5A:
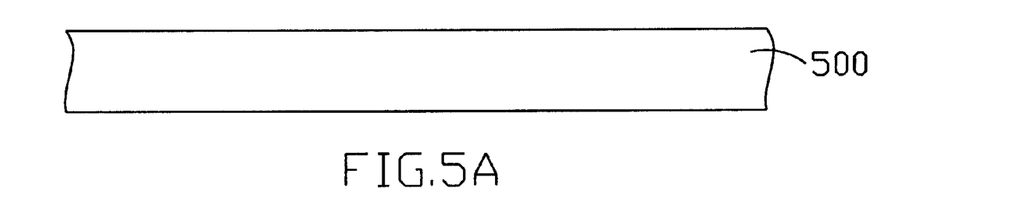
Figure 5B:
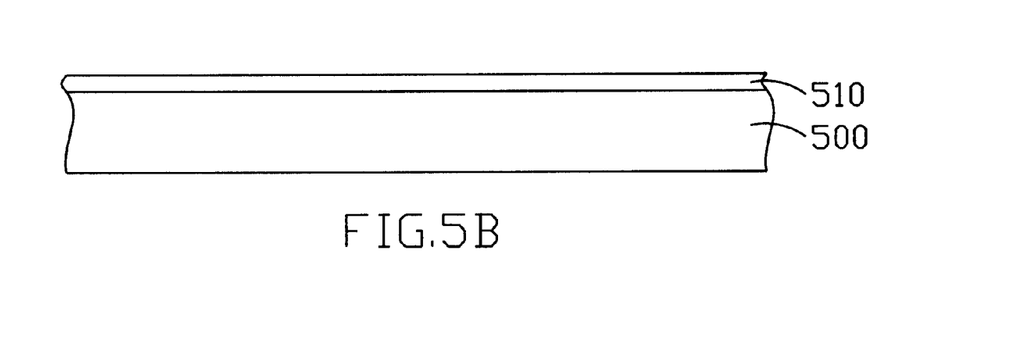
Figure 5C:
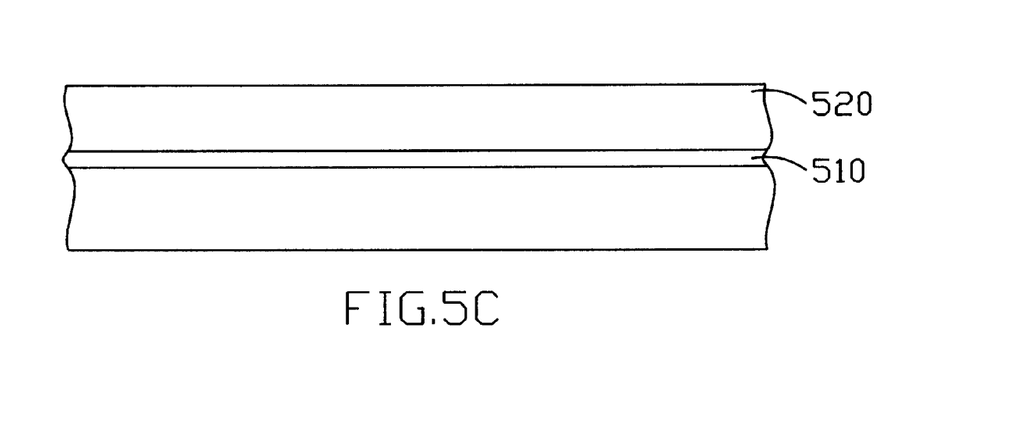
Figure 5D:
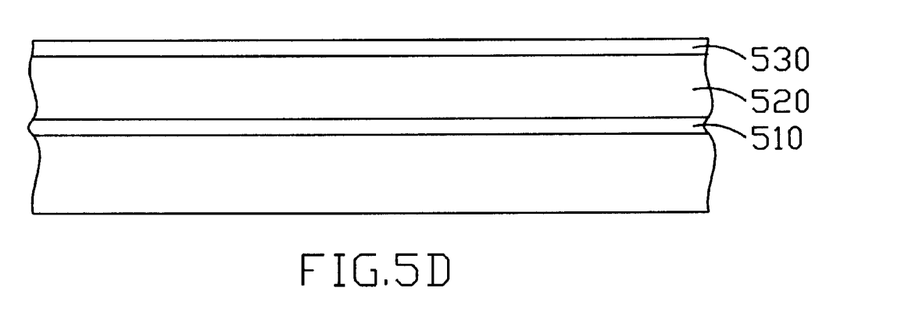

First of all, in FIG. 5A, a silicon substrate 500 is provided and is followed by FIG. 5B, the formation of an insulating film 510 on top of the silicon substrate. The insulating film functions as a gate oxide layer, which comprises silicon dioxide or any other insulating material. In FIGS. 5C and 5D, a polysilicon layer 520 and a barrier layer 530 are deposited respectively, where the polysilicon layer lays in between the insulating film 510 and the barrier layer 530. The barrier layer is made of titanium nitride (TiN).

Figure 5E:
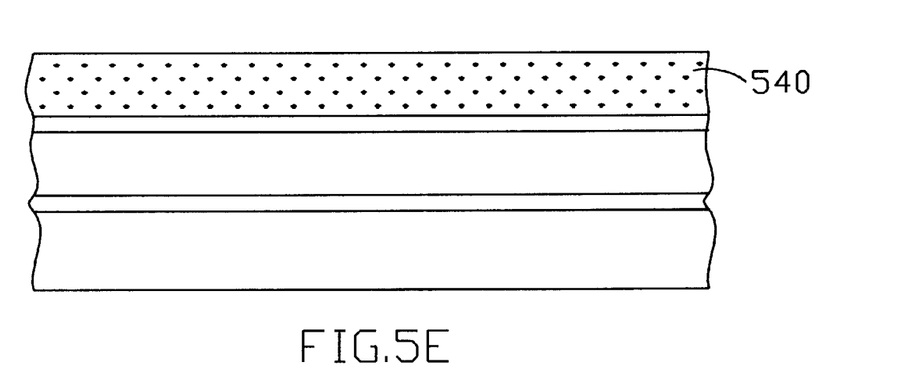
Figure 5F:
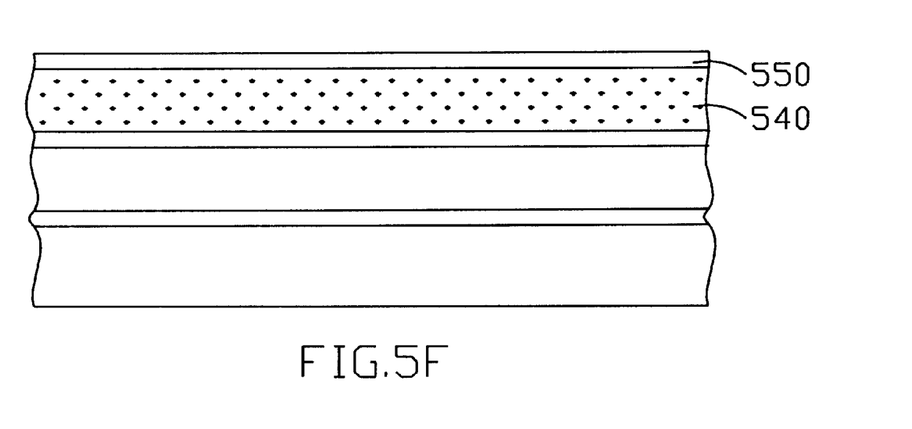

Next, a doped titanium silicide layer 540, having a better thermal-stress characteristic than the undoped ones, is deposited over the barrier layer 530, as what is shown in FIG. 5E. The formation of this silicide layer is accomplished by applying a sequence of process similar to the salicide process described in the prior art section excepts mixing nitrogen gas ($N_2$) with argon (Ar) gas during a sputtering deposition. The $N_2$ concentration is ranged from 1% to 30%. The doped titanium silicide can be formed by this particular method is mainly because $N_2$ will not result in any chemical reaction with titanium or silicon. Sequentially, an anti-reflection film 550 comprises SiON is coated over the doped titanium silicide layer 540, as referring to FIG. 5F.

Figure 5G:
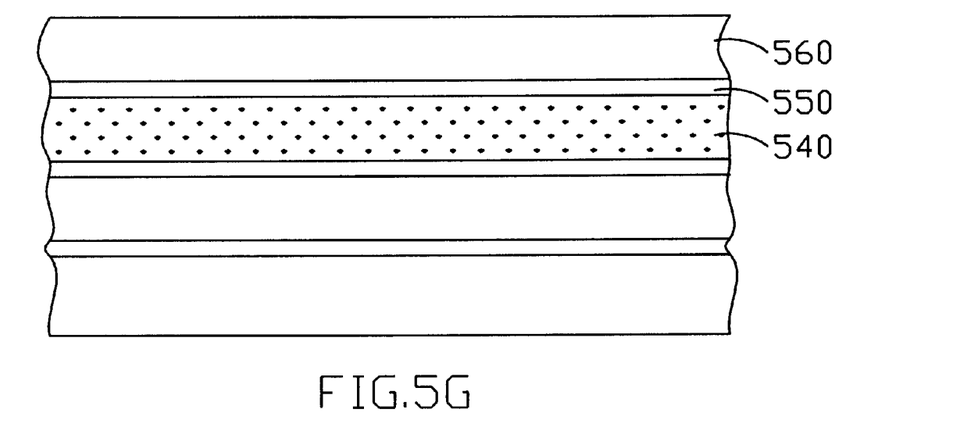
Figure 5H:
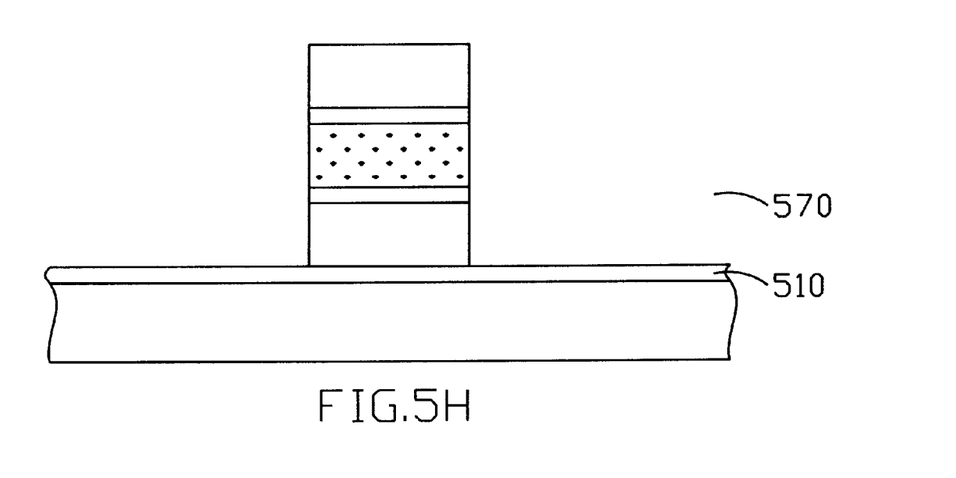

Finally, as shown in FIGS. 5G and 5H, a nitride capping layer 560 comprising silicon nitride (SiN) is formed on top of the anti-reflection film 550 and above the doped titanium silicide layer 540 for the purpose of self-aligned contact (SAC) under 0.25 micro technologies. Then, patterning and etching the above layers to expose a portion of the insulating film 510 and to form a gate electrode 570, follows by a rapid thermal process (RTP) to transform C-49 $TiSi_x$ structure to C-54 $TiSi_2$ structure.

The process flow of a further embodiment of the present invention is very similar to the previous embodiments, which comprise the following steps: First, providing a silicon substrate having a gate oxide layer formed on top the silicon substrate, and forming a polysilicon layer over the gate oxide layer, followed by the formation of a TiN layer over the polysilicon layer. A TiSi$_x$M$_y$ compound alloy layer is then formed on top of the TiN layer, where M is selected from the group consisting of tantalum (Ta), niobium (Nb), and molybdenum (Mo). The above step is the only difference as compared to the latest described embodiment. Sequentially, an anti-reflection (SiON) film is deposited on top of the TiSi$_x$M$_y$ compound alloy layer with a capping layer formed over the anti-reflection film. Finally, patterning and etching the above layers to expose a portion of the gate oxide layer and to form a gate electrode, where the final gate structure is rounded up by a rapid thermal process (RTP).

Hereto, referring to FIG. 3 again, no matter which method is used for the present invention, the treated metal silicide simply shows a better intrinsic thermal-stress characteristic than the untreated metal silicide, i.e., a wider thermal-stress window for titanium silicide.

Although specific embodiments have been illustrated and described, it will be obvious to those skilled in the art that various modifications may be made without departing from what is intended to be limited solely by the appended claims.

What is claimed is:

1. A process for fabricating a semiconductor structure, comprising:
   providing a semiconductor substrate having an insulting film formed thereon;
   forming a polysilicon layer on said insulating film;
   forming a barrier layer over said polysilicon layer and a metal silicide layer comprising a TiSi$_x$M$_y$ compound alloy formed on top of said barrier layer, wherein M of said TiSi$_x$M$_y$ compound alloy is a metal selected from the group consisting of tantalum (Ta), niobium (Nb), and molybdenum (Mo);
   depositing an anti-reflection film on top of said metal silicide layer;
   implanting a dopant into said metal silicide layer by passing through said anti-reflection film; and
   forming a capping layer over said anti reflection film.

2. The process in accordance with claim 1, wherein said dopant comprises nitrogen (N$_2$) or argon (Ar), which is used to decrease the stress and to enhance the thermal stability of said metal silicide.

3. The process in accordance with claim 2, wherein said dopant having a dosage ranging from about 1.tmes.10.sub.14 to about 5.times.10.sub.15.

4. The process in accordance with claim 2, wherein said dopant is implanted at an energy ranging from about 20 keV to about 100 keV.

5. The process in accordance with claim 1, wherein said metal silicide layer is formed while injecting a nitrogen gas at the same time.

6. The process in accordance with claim 5, wherein said nitrogen gas having a concentration ranging from about 1% to about 30%.

7. A process for fabricating a semiconductor structure, comprising:
   providing a semiconductor substrate having an insulting film formed thereon;
   forming a polysilicon layer on said insulating film;
   forming a barrier layer over said polysilicon layer and a metal silicide layer comprising a TiSi$_x$M$_y$ compound alloy formed on top of said barrier layer, wherein and x and y of said TiSi$_x$M$_y$ compound alloy are integers,
   depositing an anti-reflection film on top of said metal silicide layer;
   implanting a dopant into said metal silicide layer by passing through said anti-reflection film; and
   forming a capping layer over said anti reflection film.

8. The process in accordance with claim 1, wherein said semiconductor substrate comprises silicon.

9. The process in accordance with claim 1, wherein said insulating film is an oxide layer.

10. The process in accordance with claim 1, wherein said barrier layer comprises titanium nitride (TiN).

11. The process in accordance with claim 1, wherein said metal is selected from the group consisting of titanium (Ti), cobalt (Co), nickel (Ni), platinum (Pt), tungsten (W), molybdenum (Mo), and copper (Cu).

12. The process in accordance with claim 1, wherein said anti-reflection film comprises SiON.

13. The process in accordance with claim 1, wherein said capping layer comprises silicon nitride (SiN).

14. A process for fabricating a gate structure, comprising:
   providing a semiconductor substrate having a gate oxide layer formed thereon;
   forming a polysilicon layer on said gate oxide layer;
   forming a barrier layer over said polysilicon layer;
   depositing a TiSi$_x$M$_y$ compound alloy layer over said barrier layer, wherein M of said TiSi$_x$M$_y$ compound alloy layer is selected from the group consisting of tantalum (Ta), niobium (Nb), and molybdenum (Mo);
   depositing an anti-reflection film on top of said TiSi$_x$M$_y$ compound alloy layer;
   forming a capping layer over said anti-reflection film;
   patterning and etching said capping layer, said anti-reflection layer, said TiSi$_x$M$_y$ compound alloy layer, said barrier layer and said polysilicon layer in order to expose a portion of said gate oxide layer and to form a gate electrode; and
   carrying out a rapid thermal process (RTP).

15. The process in accordance with claim 14, wherein x and y of said TiSi$_x$M$_y$ compound alloy layer are integers.

16. The process in accordance with claim 14, wherein said semiconductor substrate comprises silicon.

17. The process in accordance with claim 14, wherein said barrier layer comprises titanium nitride (TiN).

18. The process in accordance with claim 14, wherein said anti-reflection film comprises SiON.

19. The process in accordance with claim 14, wherein said capping layer comprises silicon nitride (SiN).

20. A process for fabricating a semiconductor structure, comprising:
   providing a semiconductor substrate having an insulating film formed thereon;
   forming a polysilicon layer on said insulating film;
   forming a barrier layer over said polysilicon layer;
   depositing a TiSi$_x$M$_y$ compound alloy layer over said barrier layer, wherein M of said TiSi$_x$M$_y$ compound alloy layer is selected from the group consisting of tantalum (Ta), niobium (Nb), and molybdenum (Mo);
   depositing an anti-reflection film on top of said TiSi$_x$M$_y$ compound alloy layer; and
   forming a capping layer over said anti-reflection film.

21. The process in accordance with claim 20, wherein x and y of said TiSi$_x$M$_y$ compound alloy are integers.

22. The process in accordance with claim 20, wherein said semiconductor substrate comprises silicon.

23. The process in accordance with claim 20, wherein said insulating film is an oxide layer.

24. The process in accordance with claim 20, wherein said barrier layer comprises titanium nitride (TiN).

25. The process in accordance with claim 20, wherein said anti-reflection film comprises SiON.

26. The process in accordance with claim 20, wherein said capping layer comprises silicon nitride (SiN).

* * * * *